United States Patent [19]
Koh et al.

[11] Patent Number: 5,654,925
[45] Date of Patent: Aug. 5, 1997

[54] CIRCUIT FOR APPLYING A STRESS VOLTAGE IN SEQUENCE TO SELECTED MEMORY BLOCKS IN A SEMICONDUCTOR DEVICE

[75] Inventors: Yong-Nam Koh, Suwon; Young-Joon Choi, Seongnam, both of Rep. of Korea

[73] Assignee: Samsung Electronics

[21] Appl. No.: 634,643

[22] Filed: Apr. 18, 1996

[30] Foreign Application Priority Data

Apr. 27, 1995 [KR] Rep. of Korea ............... 10167/1995

[51] Int. Cl.$^6$ ............................................. G11C 8/00
[52] U.S. Cl. ............ 365/201; 365/185.11; 365/185.23; 365/230.03; 365/230.06
[58] Field of Search ...................... 365/201, 230.03, 365/230.08, 185.11, 185.23

[56] References Cited

U.S. PATENT DOCUMENTS 5,075,890  12/1991  Itoh et al. ............... 365/185.11 X
5,487,050  1/1996   Kim et al. .............. 365/230.03 X
5,517,456  5/1996   Chishiki ................ 365/230.03

*Primary Examiner*—Do Hyun Yoo
*Attorney, Agent, or Firm*—Marger, Johnson, McCollom & Stolowitz

[57] ABSTRACT

A circuit for applying a stress voltage for use in a semiconductor memory device includes a first control circuit for selecting a first block to which a program voltage is applied and then sequentially selecting following blocks; and a second control circuit for selecting a word line to which a stress voltage is to be applied, whereby, in a stress mode for detecting a defective cell, the stress voltage is applied to a word line connected to a memory transistor within a first selected memory block and thereafter to word lines in each of the sequentially selected memory blocks.

9 Claims, 5 Drawing Sheets

CIRCUIT FOR APPLYING A STRESS VOLTAGE IN SEQUENCE TO SELECTED MEMORY BLOCKS IN A SEMICONDUCTOR DEVICE

BACKGROUND OF THE INVENTION

1. Field of the Invention

The present invention relates to semiconductor memory devices and more particularly to a circuit for applying a stress voltage to memory cells in the device during testing of the device.

The present invention claims priority from Korean Patent Application No. 10167/1995 which is incorporated herein by reference for all purposes.

2. Description of the Related Art

As semiconductor memory devices have become more and more highly integrated, the occurrence of manufacturing defects has increased. While it is difficult to salvage a chip when defects occur in peripheral circuits, it is possible to do so when defects occur within a memory cell array by replacing the defective memory cell with a redundant memory cell. Therefore, it is important to detect defective cells in the early testing stages. There has been a strong demand for such testing techniques. However, screening techniques for defective cells which have been developed can not detect all the defective cells. Generally, failures due to defects within a memory cell array are divided into a hard cell defect which can be detected in a sorting test, and a soft cell defect which is not detected in an early stage test and yet gradually degrades in the presence of electrical fields or temperatures which are within operating specifications of the device. Ideally, screening techniques should be able to detect both the hard and soft cell defects.

In a conventional technique, all arrays are selected simultaneously in a test mode and then a stress voltage which is as high as 1.4 to 2 times the normal memory operating voltage Vet is applied to the arrays. Thereafter, defective cells are detected by checking whether or not any cells prevent normal operation of the device. That is, in the case of random access memories and mask read only memories, the status of the cells is determined by checking whether or not they operate normally in a refresh operation or when operating with a low or a high Vcc. Typical types of cell failures included a gate oxide breakdown or a junction breakdown. However, an EPROM determines binary data according to the charge applied to a floating gate, by using the hot carrier or Fowler-Nordheim tunneling, when programming or erasing data. Because cell data is easily affected by the charge, even though the gate oxide or junction leakage is weak, a defective cell may fail more easily. That is, even weak charge leakage in a bake test, burn-in test or disturb test may change data. However, when testing by selecting all arrays simultaneously and applying the stress voltage thereto, if there are a plurality of soft cell defects and hard cell defects which may cause a stress voltage drop within the array, a substantial drop in the stress voltage is caused by a hard defect cell. The stress voltage is therefore not high enough to detect a soft cell defect. This makes it difficult to accurately screen soft cell defects. Therefore, if the soft cell defects do not fail in an early stage of the test but fail gradually through the electrical stress, bake, burn-in or reliability tests, yield is reduced. Further, in order to repair the soft cell defects, an additional screening step is required, resulting in increased testing time and deteriorating the efficiency of operation. In the case of EPROM and EEPROM, there is a greater possibility of generating soft cell defects and hard cell defects in a cycling test in which the memory device is repeatedly erased and programed.

SUMMARY OF THE INVENTION

It is therefore an object of the present invention to provide a circuit capable of detecting both hard and soft cell defects in the early stages of a test even when the hard and soft cell defects occur at the same time.

It is another object of the present invention to provide a circuit capable of detecting a defective cell in the early stages of a test by applying a stress voltage only to a block selected by an external address.

To achieve the above objects of the present invention, a circuit for applying a stress voltage for use in a semiconductor memory device comprises a first control circuit for selecting a first block to which a program voltage is applied and then sequentially selecting following blocks; and a second control circuit for selecting a word line to which a stress voltage is to be applied, whereby, in a stress mode for detecting a defective cell, the stress voltage is applied to a word line connected to a memory transistor within a first selected memory block and thereafter to word lines in each of the sequentially selected memory blocks. A method for applying a stress voltage is also contemplated by the present invention.

BRIEF DESCRIPTION OF THE DRAWINGS

These and various other features and advantages of the present invention will be readily understood with reference to the following detailed description taken in conjunction with the accompanying drawings, in which.

DETAILED DESCRIPTION OF THE PREFERRED EMBODIMENT

In the following description, numerous specific details, such as memory cells, the number of bit lines, the value of voltages, circuit elements, parts and so on, are set forth in order to provide a thorough understanding of the present invention. It will be understood by those skilled in the art that other embodiments of the present invention may be practiced without these specific details, or with alternative specific details. It should be noted that the same numeral in different drawing figures identifies the same or similar structure. The term "memory cell" as used herein refers to a floating gate MOS transistor having a source, a drain floating gate and a control gate.

Figure 1:
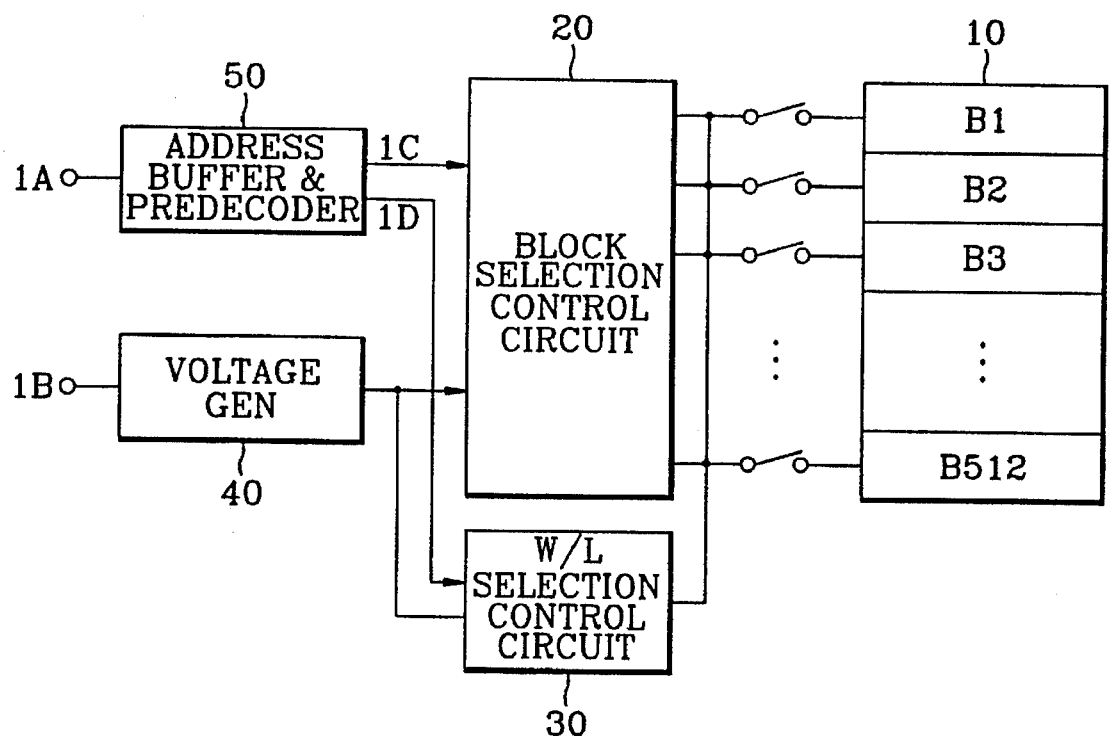
FIG. 1 is a schematic block diagram showing a nonvolatile semiconductor memory device according to the present invention.

FIG. 1 is a schematic block diagram of one example of an EEPROM according to the present invention. The memory device shown in FIG. 1 is an electrically erasable programmable nonvolatile semiconductor memory device. The construction and read/write operation of a NAND flash memory cell array, which is utilized in the preferred embodiment, is disclosed in U.S. Pat. No. 5,473,563 entitled "Nonvolatile Semiconductor Memory" and filed Dec. 22, 1993, which is incorporated herein by reference for all purposes. In FIG. 1, a main cell array 10 is composed of a plurality of row blocks B1 to B512. The driving thereof is controlled by a block selection control circuit 20 and a word line selection control circuit 30. The block selection control circuit 20 selects and activates one block of 512 blocks in response to a block selection signal input from an address buffer & predecoder 50. The word line selection control circuit 30 selects and activates at least one word line of the word lines in the selected block in response to a word line selection signal. An external address signal 1A is latched at the address buffer & predecoder 50 and then is applied to the block selection control circuit 20 and to the word line selection control circuit 30.

A voltage generator 40 generates a read voltage, a program voltage Vm1, an erase voltage required in read/write operation, and a stress voltage Vstr which is higher than the read voltage and yet lower than the program voltage Vm1. These voltages are selected in response to a voltage generation control signal 1B. The address buffer & predecoder 50 is widely used in semiconductor memories and detailed description thereof will be omitted.

Figure 2:
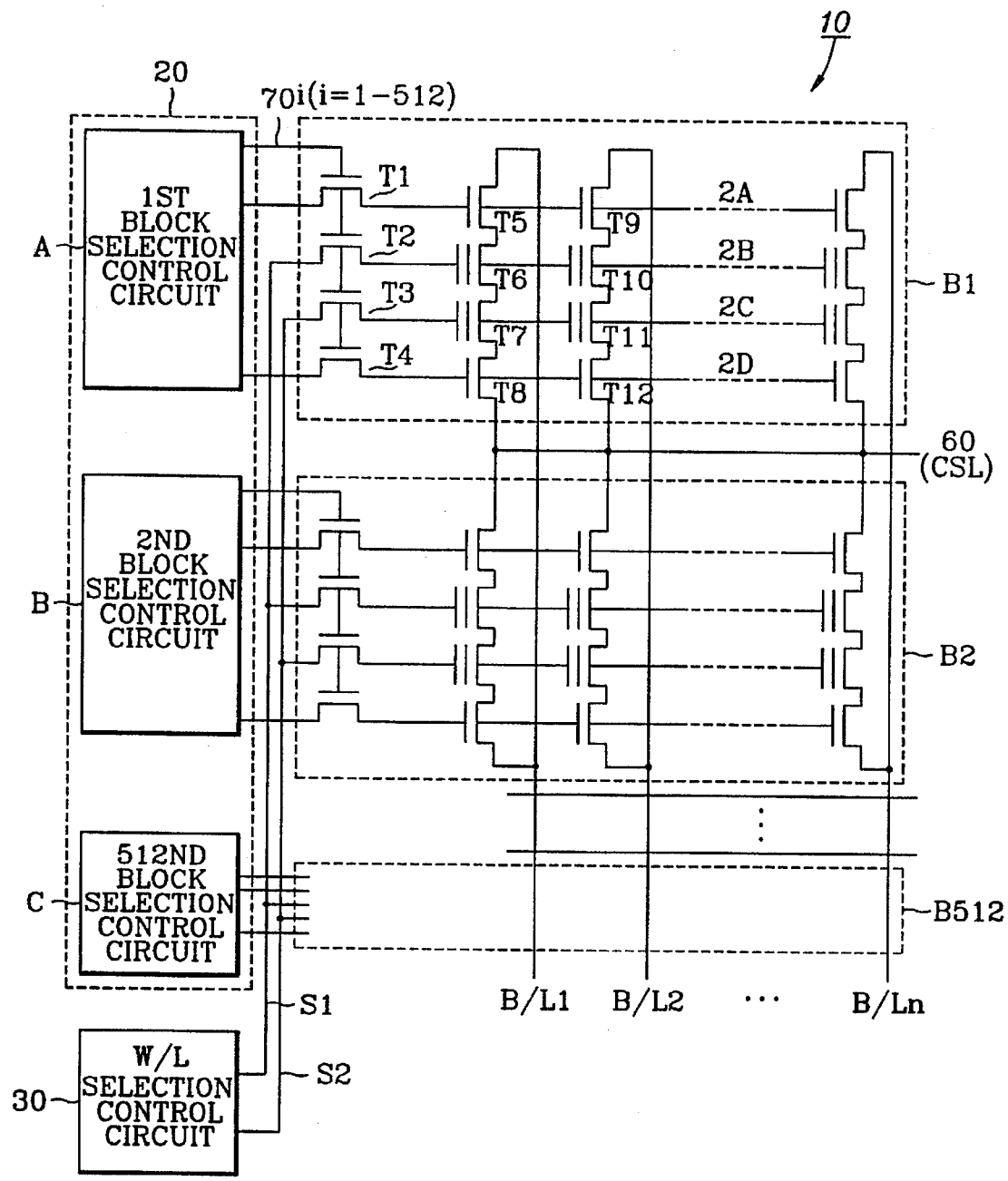
FIG. 2 is a diagram showing construction of an array according to the present invention.

FIG. 2 is a diagram showing construction of the main cell array 10 composed of 512 blocks and its peripheral circuits. In each block, memory cell transistors, like transistors T6 to T7 in block B1, for storing data are serially connected to each other. Transistors T5, T9, . . . Tn (hereinafter referred to as 2A or selection transistors) are connected between the memory cell transistors T6, T10, . . . Tn and bit lines B/L1~B/Ln. Transistors T8, T12, . . . Tn (hereinafter referred to as 2D or selection transistors) are connected between the memory cell transistors (T7, T11, . . . Tn) and a common source line (CSL) 60. Word line pass transistors T2 and T3 are connected between the gates of the memory cell transistors T6 and T7 and the word line selection control circuit 30 for applying the read voltage, program voltage, erase voltage and stress voltage to the gates of the memory cell transistors. Control gates 70i(i=1–512) of the word line pass transistors T2 and T3 and of the selection line pass transistors T1 and T4 are connected to a first block selection control circuit 20A. The CSL 60 is commonly connected to all blocks and provides a ground potential to the memory cell transistors.

Figure 3:
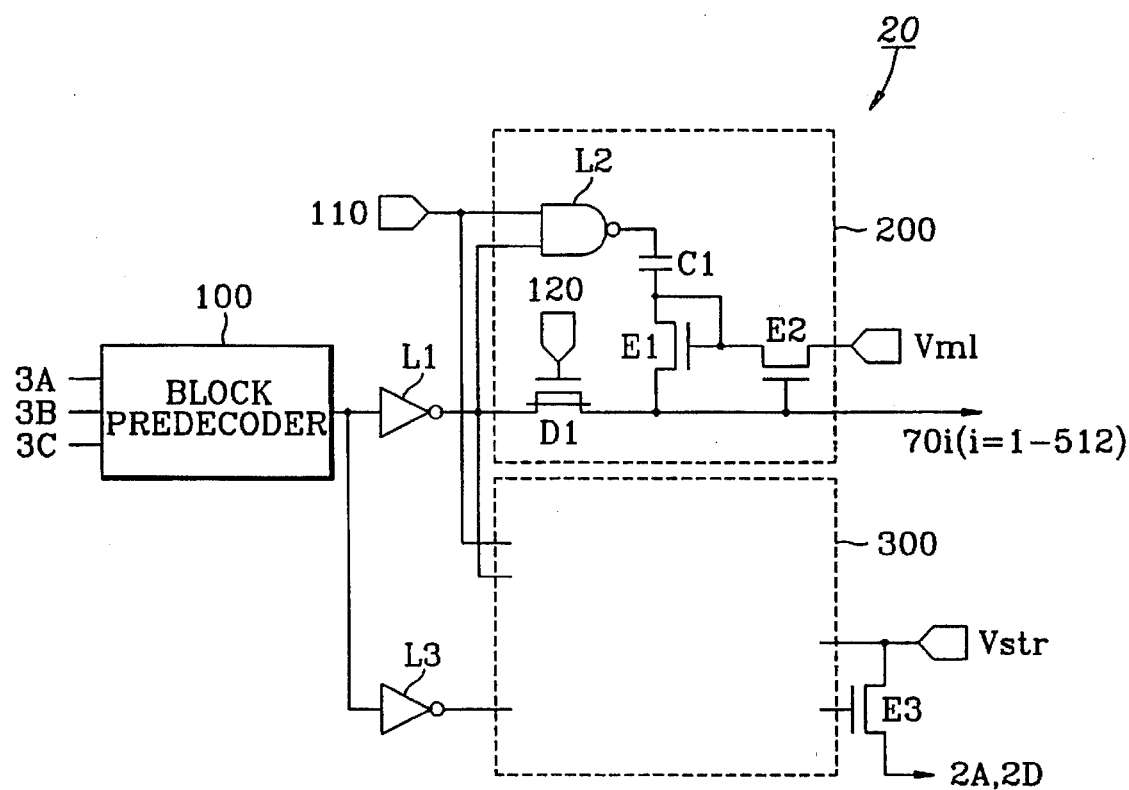
FIG. 3 is a circuit diagram showing a block selection control circuit according to a preferred embodiment of the present invention.

FIG. 3 is a diagram showing the block selection control circuit 20 according to a preferred embodiment of the present invention. The block selection control circuit 20 has a block predecoder 100, a first switch pump circuit 200, a second switch pump circuit 300 and a transistor E3. The block predecoder 100 receives address signals 3A, 3B and 3C which have been decoded at the address buffer & predecoder 50. The first switch pump circuit 200 is driven by an output of an invertor L1, which receives an input from the output of the block predecoder 100; an external signal 110; and a program voltage Vm1 which is higher than the stress voltage Vstr by more than 1 V. The second switch pump circuit 300 is driven by the outputs of invertor L1 and L3; the external signal 110; and the stress voltage Vstr. The transistor E3 passes the stress voltage Vstr in response to an output of the second switch pump circuit 300. The outputs of the transistor E3 are connected to control gates 70i(i= 1–512) of the word and selection line pass transistors T2 and T3 and T1 and T4, respectively.

Figure 4:
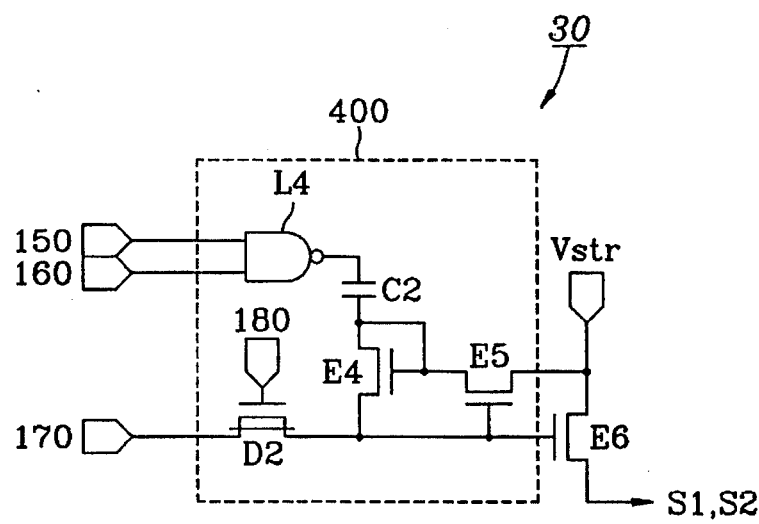
FIG. 4 is a circuit diagram showing a word line selection control circuit according to a preferred embodiment of the present invention.

FIG. 4 is a diagram showing a preferred embodiment of the word line selection control circuit 30 including a third switch pump circuit 400 and a transistor E6. The third switch pump circuit 400 is driven by the external signal, an address signal at terminal 160 which has been latched at the address buffer & predecoder 50, a boosting signal at terminal 170 which is activated in the stress mode and the stress voltage Vstr. The transistor E6 passes the stress voltage Vstr in response to the output of the third switch pump circuit 400. The outputs S1 and S2 of the transistor E6 are respectively applied to word line pass transistors T2 and T3 in FIG. 2.

Stress mode operation of the present invention will now be described in detail. Stress mode operation commences after all cells are erased prior to applying the stress voltage to the cells in an electrically erasable nonvolatile semiconductor memory. The erase operation is disclosed in detail in the U.S. Pat. No. 5,473,563, and therefore will not be further described.

With reference to FIG. 1, in the stress mode a first block address is loaded in response to an address signal at terminal 1A. The address buffer & predecoder 50 decodes and latches the block address and then applies the block address selection signal at terminal 1C to the block selection control circuit 20. Address buffer & predecoder 50 also applies the word line selection signal 1D to the word line selection control circuit 30. In FIG. 3, when the first block address signal is generated by the address signals 3A, 3B and 3C, the output of the invertor L1 goes to logic "high" level.

In the stress mode, the voltage generator 40 generates the stress voltage Vstr which is higher than the read voltage and lower than the program voltage Vm1 in response to a voltage generation control signal at terminal 1B. A write enable signal at terminal 120 goes to logic "low" level and the program voltage Vm1 becomes 18 V. The external signal at terminal 110 oscillates from high to low. When the output of the invertor L1 goes to a logic "high" level, a voltage as high as the shut-off voltage (2 V, for example) of a depletion type transistor D1 is applied to the control gates 70i(i=1–512). When the gate voltage of enhancement type transistor E2 becomes about 2 V, the program voltage Vm1 is decreased by the threshold voltage Vt (1 V, for example) of the enhancement type transistor E2. The program voltage Vm1—Vt is thus applied to a capacitor C1. In this case, the NAND gate L2 inputs the output of a logic "high"level from the invertor L1 and the external signal 110 oscillating from high to low, and thus the output thereof oscillates from low to high. When the output of NAND gate L2 is a logic "high" level (5 V, for example), the voltage at the capacitor C1 increases (by about 5 V), to be 1 V+ΔV. The increased voltage 1 V+ΔV is applied to an enhancement type transistor E1, which reduces it by the threshold voltage Vt of the enhancement type transistor E1. Thereby, 5 V (ΔV) is applied to the gate of the enhancement type transistor E2.

With the boosting operation of the switch pump circuit as described above, the output of the first switch pump circuit 200 increases to the maximum program voltage Vm1+ΔV−2 Vt, thereby activating the first block B1. In the remaining 511 blocks, because the remaining block address signals are not generated by 3A, 3B and 3C, the output of the invertor in each block goes to a logic "low" level and thus the initial voltage required in the boosting operation is not generated, resulting in the remaining 511 blocks being inactivated. Similarly, the output of the second switch pump circuit 300, which is driven by the output of the invertor L3, increases to the stress voltage Vstr+ΔV−2 Vt. This turns on enhancement type transistor E3 which passes the stress voltage Vstr to the 2A and 2D transistors in the selected first block B1.

The word line selection control circuit 30 in FIG. 4 operates similarly to the block selection control circuit 20 in FIG. 3. That is, in the stress mode, the boosting signal at terminal 170 goes to a logic "high" level, and the address signal at terminal 160, which has been latched at the address buffer & predecoder 50, goes to a logic "high" level responsive to the external address. The output of the third switch pump circuit 400 increases to the maximum stress voltage Vstr+ΔV−2 Vt and the stress voltage Vstr is applied to drains of the word line pass transistors T2 and T3 in FIG. 2 through the enhancement type transistor E6. The word line selection control circuit has outputs equal in number to the number of the word lines in the first block B1. These outputs, as illustrated by two such outputs, S1 and S2, are commonly connected to all blocks. The control gate voltage of the selected block is program voltage+ΔV×2 Vt with the control gate voltages of the unselected blocks being 0 V. Thus, the output of the word line selection control circuit 30, namely the stress voltage Vstr, is applied only to the word line of the selected block.

The first block B1 is selected by decoding the external address and the stress voltage is applied only to the first block B1 for a predetermined time. After applying the stress voltage to the first block B1, the address of the following block is decoded and the remaining 511 blocks are inactivated. The operation of applying the stress voltage to the following block is the same as the first block B1. If the stress voltage is applied to a block having a defective cell which causes leakage, the stress voltage drops due to the defective cell. Thus, in the case of applying the stress voltage to a single block, the failure due to the defects can be detected. Therefore, it is possible to repair the device by replacing only the cell within the failed block with a redundant cell. The voltage relationship of significant portions of selected and unselected memory blocks during the stress mode can be summarized in the following TABLE 1.

TABLE 1

|  | CG | WL | 2A TRANSISTOR | 2D TRANSISTOR | CSL | B/L |
| --- | --- | --- | --- | --- | --- | --- |
| SELECTED BLOCK | VML + ΔV-2Vt | Vstr | Vstr | Vstr | 0V | 0V |
| UNSELECTED BLOCKS | 0V | 0V | 0V | 0V | 0V | 0V |

Figure 5:
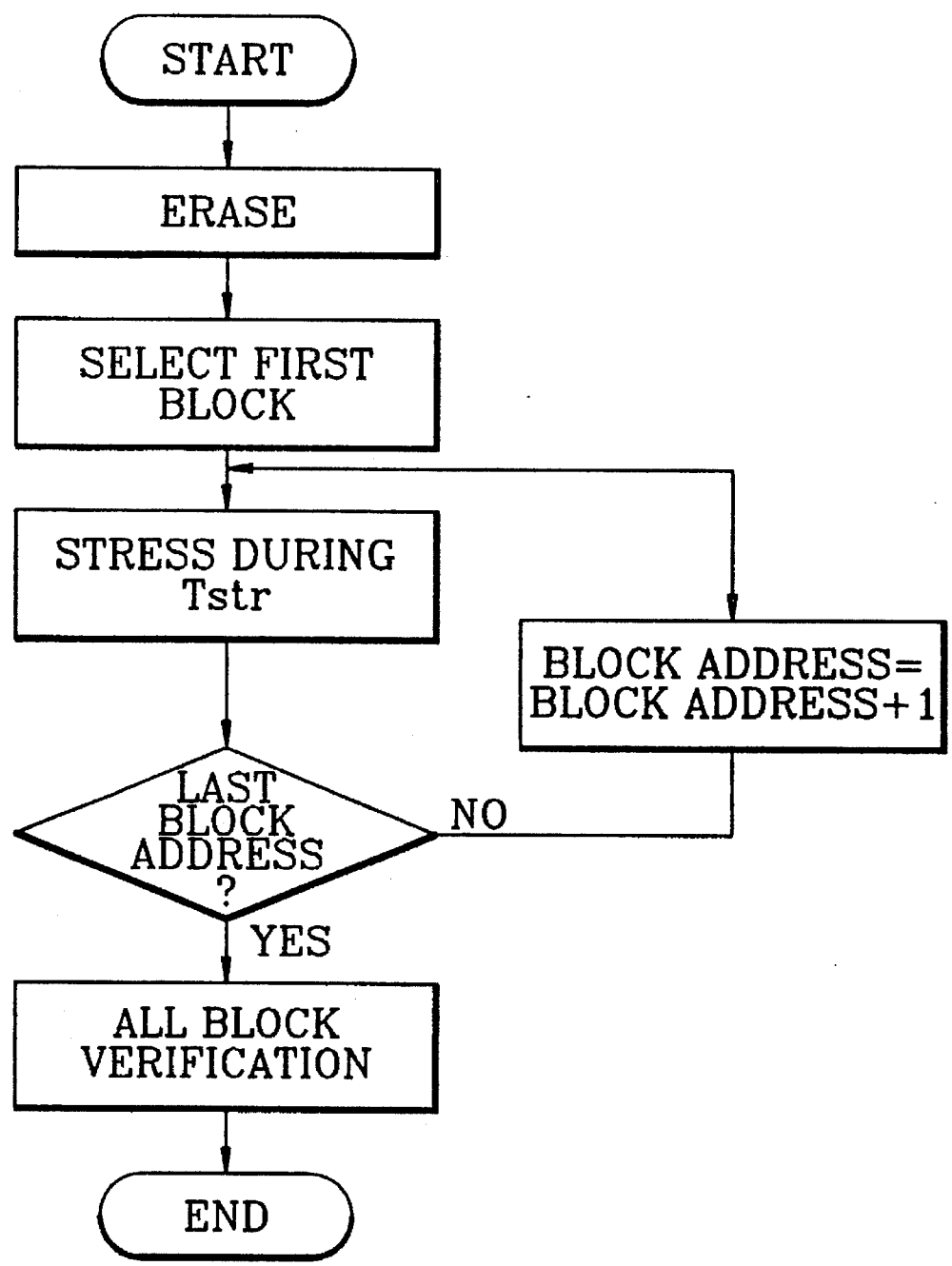
FIG. 5 is a flow chart showing operation of the present invention.

FIG. 5 is a flow chart showing operations according to the present invention. After all arrays are erased, a stress mode is set up. The first block is selected by an external address and the stress voltage is applied to all cells within the selected first block. After lapse of a predetermined time Tstr, i.e., after completion of applying the stress voltage to the first block, an external comparator compares the following block address with the last block address. If the following block address is not identical to the last block address, the block address is increased by one and the stress voltage is applied. If the following block address is identical to the last block address, the stress voltage is not applied and all blocks are verified, thus ending stress voltage testing operation.

Figure 6:
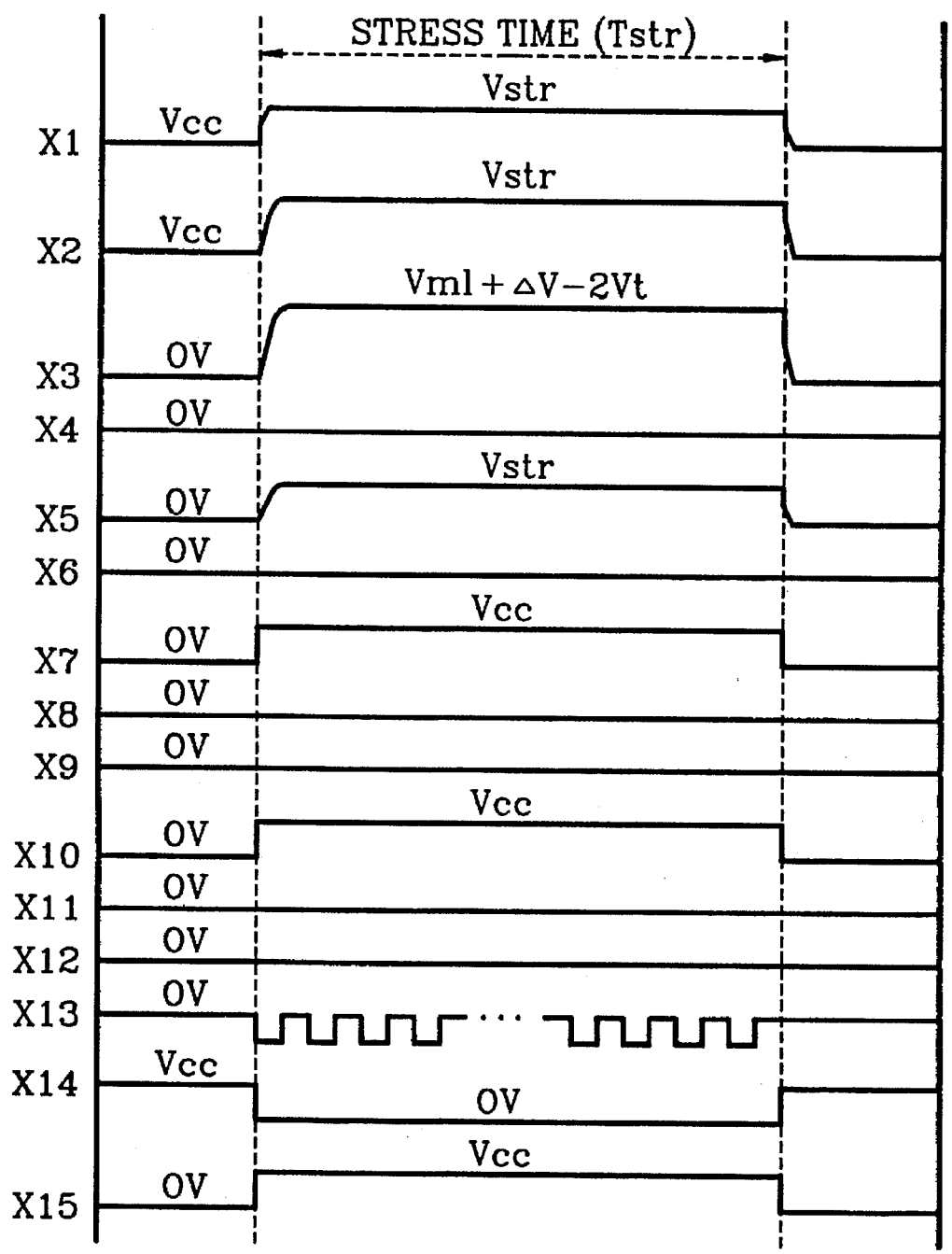
FIG. 6 is a timing chart of various signals used in a stress mode according to the present invention.

FIG. 6 is a timing diagram of various signals used in the stress mode according to the present invention. X1 is a stress voltage signal, X2 is a program voltage signal, X3 is a control gate signal of the selected block, X4 is a control gate signal of the remaining unselected blocks, X5 is a word line signal of the selected block, X6 is a word line signal of the unselected blocks, X7 is a 2A transistor signal of the selected block, X8 is a 2A transistor signal of the unselected blocks, X9 is a 2D transistor signal of the selected block, X10 is a 2D transistor signal of the unselected blocks, X11 is a CSL signal of the selected and unselected blocks, X12 is a B/L signal of the selected and unselected blocks, X13 is an external signal at terminal 110, X14 is a write enable signal at terminal 120, and X15 is a boosting signal at terminal 170.

As described above, the present invention is capable of detecting soft defects within a selected block in the early stages of testing by applying the stress voltage only to the selected block thus reducing the test time and enhancing the efficiency of the operation.

While there has been illustrated and described what is considered to be preferred embodiment of the present invention, it will be understood by those skilled in the art that various changes and modifications may be made without departing from the scope of the present invention. Therefore, it is intended that the present invention not be limited to the particular embodiment disclosed as the best mode contemplated for carrying out the present invention, but that the present invention includes all embodiments falling within the scope of the appended claims.

We claim:

1. A circuit for applying a stress voltage in a nonvolatile semiconductor memory EPROM having (a) a plurality of memory blocks which each include a plurality of cell units arranged in a matrix of rows and columns, said cell units including a predetermined number of transistors which are connected to form at least one word line; and (b) a decoder for generating a block selection signal and a word line selection signal, said circuit comprising:

a first control unit for selecting a memory block responsive to the block selection signal;

a second control unit for selecting a word line in the selected memory block responsive to the word line selection signal; and a voltage generator for generating the stress voltage, when in a testing mode, and read, program and erase voltages when said EPROM is in operable condition, said voltage generator being operably connected to said second control unit for providing the stress voltage to the word line in the selected memory block during the testing mode.

2. The circuit of claim 1 wherein each word line includes a word line pass transistor and wherein said first control unit includes a charge pump operably connected to said word line pass transistor, said word line pass transistor being turned on by said charge pump in response to the block selection signal.

3. The circuit of claim 1 wherein each word line includes a word line pass transistor and wherein said second control unit comprises a charge pump operably connected to said word line pass transistor, the stress voltage being supplied to said word line via said word line pass transistor.

4. The circuit of claim 1 wherein the transistor is in each cell unit include a plurality of bit lines each including a plurality of serially connected memory transistors and a selection transistor serially connected to a memory transistor at each end of the bit line and wherein the selection transistors at either end of the bit lines are respectively connected to form a pair of selection lines, said voltage generator being operably connected to said first control unit for providing the stress voltage to the selection lines in the selected memory block during the testing mode.

5. The circuit of claim 4 wherein each selection line includes a selection line pass transistor and wherein said first control unit comprises a charge pump operably connected to said selection line pass transistors, said selection line pass transistors being turned on by said charge pump in response to the block selection signal.

6. The circuit of claim 4 wherein each selection line includes a selection line pass transistor and wherein said first control unit comprises a charge pump operably connected to said selection line pass transistor, the stress voltage being supplied to said selection lines via said selection line pass transistors.

7. A control circuit for a semiconductor memory device comprising:
   a block predecoder for receiving an output of an address buffer and predecoder in said memory device;
   a first charge pump operably connected to said block predecoder and operable in a stress test mode in which a boosted voltage is supplied to select a block of memory cells in said memory device;
   a second charge pump operably connected to said block predecoder and operable in the stress test mode to supply a stress voltage to the memory cells in the selected block; and
   a third charge pump operably connected to said address buffer and predecoder and operable in the stress test mode to supply a stress voltage to selection transistors in the selected block.

8. The control circuit of claim 7 wherein the control circuit further includes a MOS transistor having a drain connected to a stress voltage input terminal of said third charge pump and a gate connected to an output terminal of said third charge pump.

9. A control circuit for a semiconductor memory device comprising:
   a block predecoder for receiving an output of an address buffer and predecoder in said memory device;
   a first charge pump operably connected to said block predecoder and operable in a stress test mode in which a boosted voltage is supplied to select a block of memory cells in said memory device;
   a second charge pump operably connected to said block predecoder and operable in the stress test mode to supply a stress voltage to the memory cells in the selected block; and
   a MOS transistor having a drain connected to a stress voltage input terminal of said second charge pump and a gate connected to an output terminal of said second charge pump.

* * * * *

UNITED STATES PATENT AND TRADEMARK OFFICE
CERTIFICATE OF CORRECTION

PATENT NO. : 5,654,925
DATED : August 5, 1997
INVENTOR(S) : Koh et al.

It is certified that error appears in the above-indentified patent and that said Letters Patent is hereby corrected as shown below:

In Abstract, line 7, change "call" to --cell--;
Column 1, line 38, change "Vet" to --Vcc--;
Column 3, line 43, change "1-512" to --1~512--;
Column 3, line 66, change "1-512" to --1~512--;
Column 4, line 38, change "1-512" to --1~512--;
Column 5, Table 1, change "WL" to --W/L--.

Signed and Sealed this

Twenty-fourth Day of February, 1998

Attest:

BRUCE LEHMAN

Attesting Officer     Commissioner of Patents and Trademarks

UNITED STATES PATENT AND TRADEMARK OFFICE
CERTIFICATE OF CORRECTION

PATENT NO.   : 5,654,925
DATED        : August 5, 1997
INVENTOR(S)  : Koh et al.

It is certified that error appears in the above-identified patent and that said Letters Patent is hereby corrected as shown below:

<u>Title page,</u>
Item [57], ABSTRACT,
Line 7, "defective call" should read -- defective cell --.

<u>Column 3,</u>
Lines 43 and 66, "(i=1-512)" should read -- (i=1~512) --.

<u>Column 4,</u>
Line 38, "(i=1-512)" should read -- (i=1~512) --.

<u>Column 5,</u>
Line 40, "WL" should read -- W/L --.

<u>Column 6,</u>
Line 66, "transistor is in" should read -- transistors in --.

Signed and Sealed this

Fifth Day of November, 2002

*Attest:*

JAMES E. ROGAN
*Director of the United States Patent and Trademark Office*

*Attesting Officer*